United States Patent
Beckman et al.

(10) Patent No.: US 7,185,302 B1
(45) Date of Patent: Feb. 27, 2007

(54) METHOD FOR GENERATING LAYOUTS BY CHAMFERING CORNERS OF POLYGONS

(75) Inventors: John C. Beckman, South Hamilton, MA (US); John P. Curcio, Saint Paul, MN (US)

(73) Assignee: Polar Semiconductor, Inc., Bloomington, MN (US)

( * ) Notice: Subject to any disclaimer, the term of this patent is extended or adjusted under 35 U.S.C. 154(b) by 248 days.

(21) Appl. No.: 10/857,822

(22) Filed: Jun. 1, 2004

(51) Int. Cl.
*G06F 17/50* (2006.01)
(52) U.S. Cl. .............................. 716/8; 716/2
(58) Field of Classification Search ............ 716/2, 716/8
See application file for complete search history.

(56) References Cited

U.S. PATENT DOCUMENTS 5,412,239 A * 5/1995 Williams .................. 257/343

OTHER PUBLICATIONS

McGrath et al., "Design Integrity and Immunity Checking: A New Look at Layout Verification and Design Rule Checking", 1980, ACM, pp. 263-268.*
Cadence Design Systems, Inc., Diva® Reference Manual, Jun. 2000, pp. 189-201.

* cited by examiner

*Primary Examiner*—Sun James Lin
(74) *Attorney, Agent, or Firm*—Kinney & Lange, PA

(57) ABSTRACT

A method for generating a layout of a semiconductor circuit to satisfy minimum spacing requirements that includes generating one or more polygons for the layout, with each generated polygon having an area, a plurality of corners and satisfying the minimum spacing requirements of the layout rules. The corners of the generated polygon are then chamfered, and the generated polygon with chamfered corners is expanded or reduced in size.

27 Claims, 10 Drawing Sheets

METHOD FOR GENERATING LAYOUTS BY CHAMFERING CORNERS OF POLYGONS

FIELD OF THE INVENTION

This invention relates to a method for generating the layout of a semiconductor circuit by chamfering the corners of generated polygons prior to changing the size of the generated polygons in order to maintain minimum spacing requirements between the generated polygons and minimum width requirements within a given generated polygon.

BACKGROUND OF THE INVENTION

In fabricating a semiconductor chip, one of the steps is to generate the layout of the chip. The layout is a graphical representation of the different layers of a semiconductor chip. The layout of a semiconductor chip might show, for example, where metal layers are to be deposited on the chip, or where dopant is to be added to the substrate. The layout of a semiconductor chip is used as a template during the fabrication process.

Because a semiconductor chip contains many complex electrical circuits, a layout is usually generated using computer software. This software allows the designer to prepare the layout by arranging various shapes, referred to as polygons, on the surface of the chip. These polygons, being graphical representations in a computer program, may be manipulated by the layout designer. The polygons can, for example, be moved around to different places in the layout, increased or decreased in size, or copied from one layer of the layout to another.

Semiconductor chips are very small, and space is at a premium. Thus, one typical design goal is to minimize the amount of space that a circuit occupies on the surface of the chip. However, it is also important that the circuit components not be too close together. When a semiconductor chip is fabricated, microscopic quantities of material are added to or removed from the chip, using the layout as a template. For example, a square might be used to indicate the place on a chip where dopant is to be injected into the substrate. If two of the squares are arranged too closely together in the layout, the doped areas may interract, causing undesirable effects to the circuit.

Therefore, before preparing the layout of a semiconductor chip, a set of rules regarding the relationship of polygons in the layout is prepared. This set of rules includes a minimum separation distance between polygons.

However, minimum separation requirements become a problem when the size of polygons is changed. One common procedure used in designing the layout of a semiconductor chip is to generate a polygon on one layer of the chip by copying a polygon from another layer. The copied polygon is often changed in size, by either shrinking or growing it, before it is placed on the second layer.

Polygons are arranged on a square grid, so they may be arranged either vertically, horizontally or diagonally with respect to one another. If two polygons are arranged vertically or horizontally with respect to each another, the shortest distance between the two polygons is the distance between a side of one polygon and a side of the other polygon. If the two polygons are enlarged, the distance between the two nearest sides of the two vertically or horizontally arranged polygons will decrease. However, if two polygons are arranged diagonally, the shortest distance between the two polygons will be the distance between the corner of one polygon and the corner of the other polygon.

If the two diagonally arranged polygons are enlarged to the same extent as the two vertically or horizontally arranged polygons, the distance between the corners of the two diagonally arranged polygons will decrease more than the distance between the sides of two vertically or horizontally arranged polygons.

The reason for this difference is that when the distance between sides of two vertically or horizontally spaced polygons changes by a factor of G, the distance between the corners of two diagonally spaced polygons changes by a factor of $G*\text{cosecant}(\theta/2)$, where $\theta$ is the angle formed by the two sides of the polygon that intersect to form the corner of the polygon. Because cosecants are always greater than 1 for angles greater than 0 degrees and smaller than 180 degrees, the position of the corner will change more than the position of the side changes.

The same problem occurs when a polygon is reduced in size. A polygon may have two corners that are separated by an interior distance D. If the polygon is reduced in size, the interior distance between the corners will decrease to a greater extent than the length of the sides changes. If the interior corners are not separated by the minimum distance required by the layout rules, the device that polygon represents may have undesirable properties.

As a result, growing or shrinking polygons while maintaining minimum distance requirements in the layout rules creates a problem in layout design. The prior art attempted to solve this problem in three ways, but none of them has been satisfactory.

One solution used in the prior art is to design the layout for the original polygons to eliminate the problem. For example, in order to solve the problem created by enlarging polygons, if a certain minimum separation distance of the enlarged polygons is required, one could space the original polygons much farther apart than the minimum separation distance. Then, when the polygons are enlarged, the enlarged polygons will be separated by at least the minimum separation distance. However, this solution is not satisfactory because it requires the layout rules to be larger, thereby increasing the cost of manufacture. Also, the solution in the prior art becomes unworkable if the layout rules allow arbitrarily acute angles, because the cosecant of an angle goes to infinity as the size of the angle goes to zero. A similar approach is used to shrink polygons by requiring the original polygon to be wider than necessary. Again, this solution in the prior art increases the size of the layout rules, thereby increasing the cost to manufacture. Also, this solution for shrinking polygons does not work for very small angles.

A second solution used in the prior art to solve this problem is the one used by Cadence Design Systems, Inc. in its Virtuoso® Layout Editor software. This software chamfers the corners of acute angles before they are enlarged, so that they grow no more than right angles grow. This solution limits the severity of the problem for the specific case of acute angles, but it does not solve the problem because all corners still grow more than the growth distance for the edges.

A third solution used in the prior art is to manually adjust the original polygons in the particular cases that cause problems. Thus, instead of changing the layout rules for all polygons the layout rules remain unchanged, but individual polygons are changed on a case-by-case basis. However, this solution in the prior art does not solve the problem because it still increases the layout area required and the manual intervention increases the time and cost of the layout.

Therefore, it is desirable to develop a method generating polygons that are smaller or larger than the original polygons, without requiring the rules to be changed, and without requiring manual adjustment of the layout.

BRIEF SUMMARY OF THE INVENTION

Briefly, the present invention is a method for generating the layout of a semiconductor circuit by chamfering corners of polygons in the layout prior to increasing or decreasing the size of the polygon. This avoids minimum space violations set forth in the layout rules.

DETAILED DESCRIPTION

The invention is a method to increase or decrease the size of one or more polygons in a semiconductor circuit layout without violating minimum spacing requirements. The method includes copying the original polygons, chamfering corners of the polygons, and then changing the size of the polygons. This process transforms the corner of a polygon into an additional side of the polygon, thereby preventing the distance between corners polygons from changing to a greater extent than the distance between sides.

Figure 1:
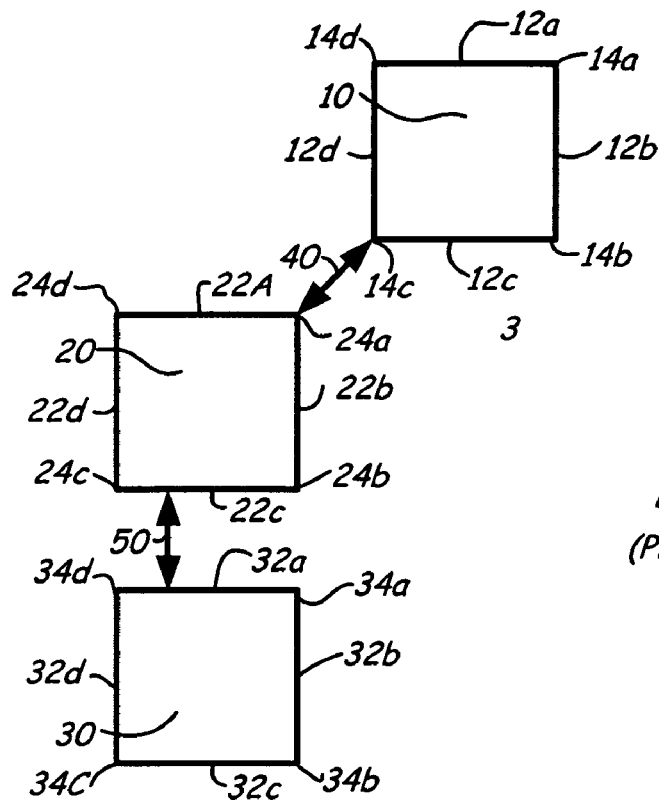
FIG. 1 shows three polygons arranged in a semiconductor layout.

FIG. 1 provides an example of an arrangement of polygons in a semiconductor layout. FIG. 1 includes polygons 10, 20 and 30. Polygons 10 and 20 are spaced apart diagonally, while polygons 20 and 30 are spaced apart vertically. Polygon 10 has sides 12a, 12b, 12c and 12d. It also has corners 14a, 14b, 14c, and 14d. Polygon 20 has sides 22a, 22b, 22c, and 22d. It also has corners 24a, 24b, 24c, and 24d. Polygon 30 has sides 32a, 32b, 32c, and 32d. It also has corners 34a, 34b, 34c, and 34d.

In FIG. 1, all of the polygons are squares. However, the problem demonstrated is not unique to squares; the same problem arises with any polygon, regardless of the number of sides or number of corners. Nor do all of the polygons have to be the same shape. The same problem could arise with a combination of differently shaped polygons.

Polygons 10 and 20 are separated by a distance 40. Distance 40 separates corner 14c of polygon 10 from corner 24a of polygon 20. Polygons 20 and 30 are separated by a distance 50. Distance 50 separates side 22c of polygon 20 and side 32a of polygon 30. Distance 40 and distance 50 are both equal to a distance, D, that is the minimum spacing allowed by the layout rules.

Figure 2:
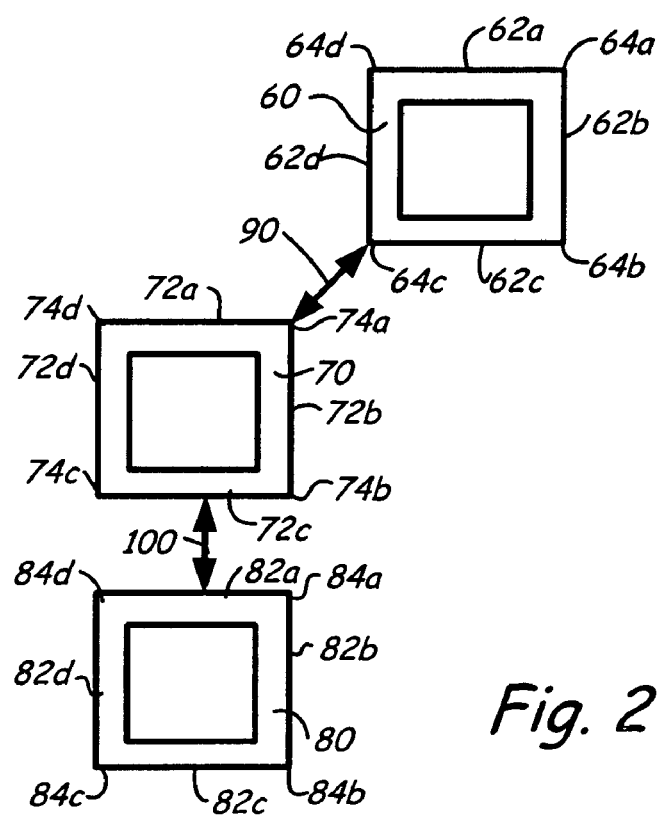
FIG. 2 shows the polygons of FIG. 1 after the polygons have been copied and enlarged. It also shows the polygons of FIG. 1 for comparison.

FIG. 2 demonstrates the problem solved by the invention. For purposes of example, assume that the circuit designer needs to copy polygons 10, 20 and 30, all of which exist on layer "A," change the layer of the copies to layer "B," and enlarge the generated polygons (the copies). FIG. 2 shows enlarged polygons 60, 70 and 80. Polygon 60 is created by copying polygon 10, changing the copy to layer "B," and then increasing the length of sides 12a, 12b, 12c and 12d, resulting in sides 62a, 62b, 62c, and 62d. Similarly, polygon 70 is created by copying polygon 20, changing the copy to layer "B," and increasing the length of sides 22a, 22b, 22c, and 22d, resulting in sides 72a, 72b, 72c, and 72d. Polygon 80 is created by copying polygon 30, changing the copy to layer "B," and pushing out sides 32a, 32b, 32c and 32d, resulting in sides 82a, 82b, 82c and 82d. All sides of the polygon are pushed out by the same amount.

The closest distance between polygon 60 and polygon 70 is the distance between corner 64c of polygon 60 and corner 74a of polygon 70. This distance is shown as distance 90 in FIG. 2. The closest distance between polygon 70 and polygon 80 is distance 100 in FIG. 2.

For example, suppose that the layout design rules require that all polygons on layer "A" must be separated by a minimum distance of 1.0 microns, and all polygons on layer "B" must be separated by a minimum distance of 0.6 microns. The distances between the original polygons on layer "A," distance 40 and distance 50 in FIG. 1, are 1 micron. If the polygons are enlarged by pushing each side out by 0.2 microns, then distance 100 between polygon 70 and 80 is 0.6 microns, which satisfies the minimum spacing requirements for polygons on layer "B." However, distance 90 between polygon 60 and polygon 70 is approximately 0.44 microns, which violates the minimum layout rule for polygons on layer "B."Thus, the enlarged polygons in FIG. 2 would not be acceptable for use in the layout.

Figure 3:
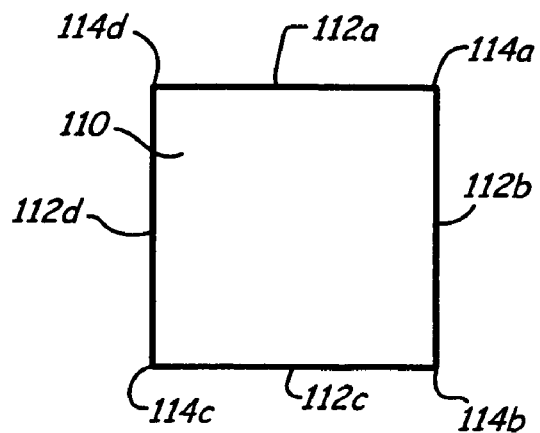
FIG. 3 shows a copy of the polygons of FIG. 1.
Figure 3:
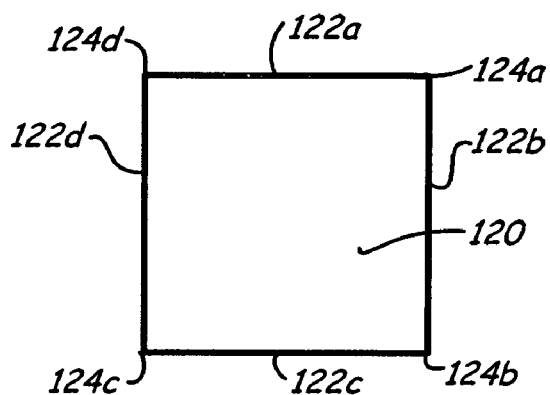
Figure 3:
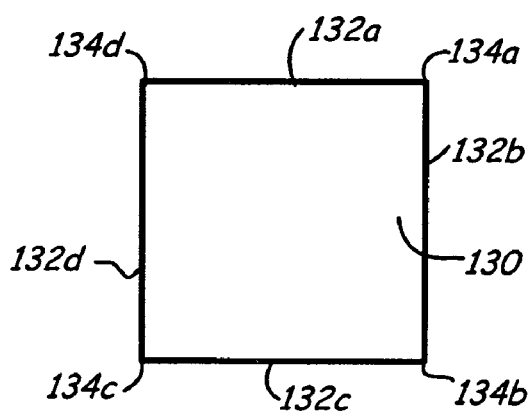
Figure 4:
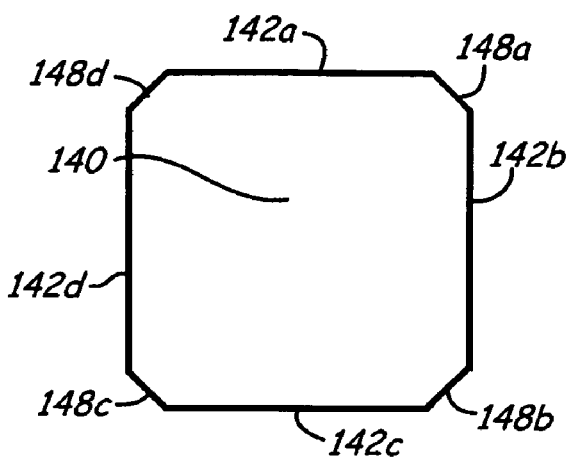
FIG. 4 shows the polygons of FIG. 3 with chamfered corners.
Figure 4:
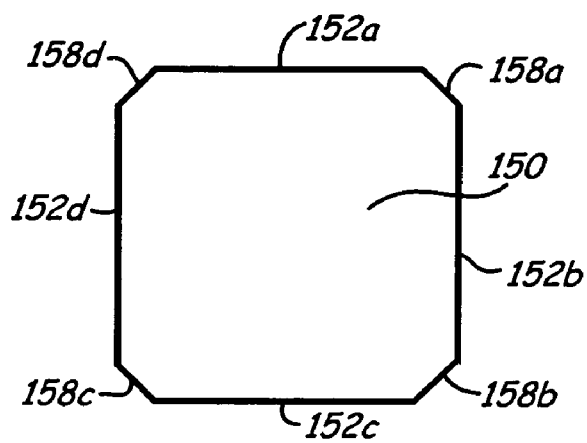
Figure 4:
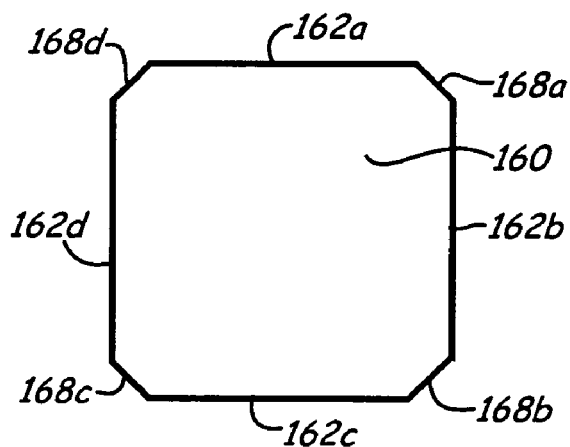
Figure 5:
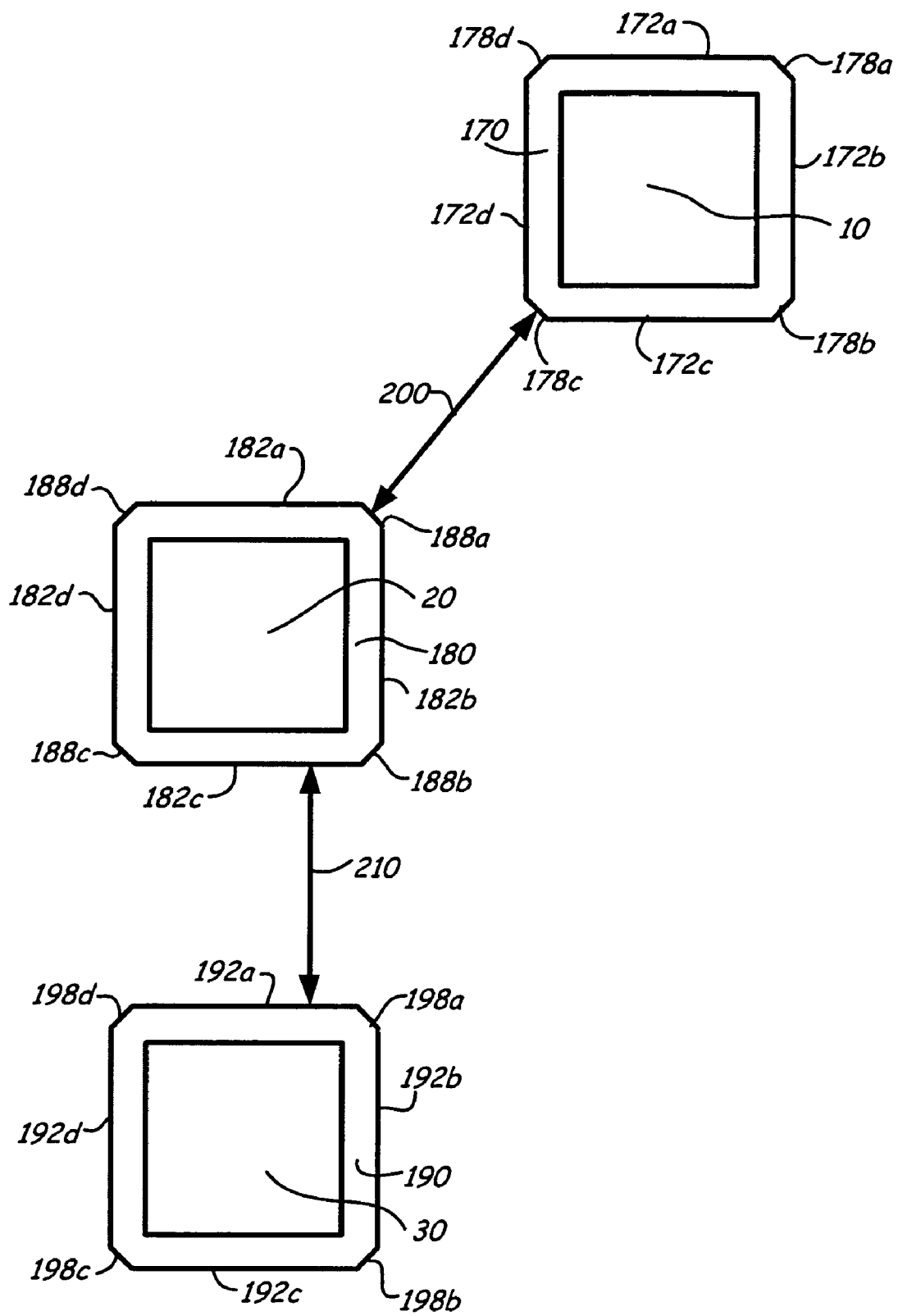
FIG. 5 shows the polygons FIG. 4 after they have been enlarged. It also shows the polygons of FIG. 1 for comparison.

FIGS. 3–5 show how this problem is solved by the invention. First, polygons 10, 20 and 30 are copied to layer "B." FIG. 3 shows polygons 110, 120 and 130, which are copies on layer "B" of polygons 10, 20 and 30, respectively. Polygon 110 has sides 112a, 112b, 112c and 112d. It also has corners 114a, 114b, 114c and 114d. Polygon 120 has sides 122a, 122b, 122c, and 122d and corners 124a, 124b, 124c, and 124d. Polygon 130 has sides 132a, 132b, 132c, and 132d and corners 134a, 134b, 134c, and 134d.

Next, all of the corners of the polygons on layer "B" are chamfered, resulting in chamfered polygons 140, 150 and 160, which are shown in FIG. 4. Chamfered polygon 140 has sides 142a, 142b, 142c, and 142d. Instead of having corners like polygon 110, however, chamfered polygon 140 has chamfered sides 148a, 148b, 148c and 148d. Similarly, chamfered polygon 150 includes sides 152a, 152b, 152c, and 152d and chamfered sides 158a, 158b, 158c, and 158d. Chamfered polygon 160 includes sides 162a, 162b, 162c, and 162d and chamfered sides 168a, 168b, 168c, and 168d.

The third and final step of the invention is to enlarge polygons 140, 150 and 160 by pushing out all of the sides by the same amount. The result is enlarged polygons 170, 180 and 190, which are shown in FIG. 5. The closest distance between enlarged polygon 170 and 180 is distance 200, and the closest distance between enlarged polygon 180 and enlarged polygon 190 is distance 210.

For example, assume that, as in the previous example discussed with respect to FIG. 2, original polygons 10, 20 and 30 on layer "A" are all separated by a distance of 1 micron, so that distance 40 and distance 50 are both equal to 1 micron. Also assume that the sides of the three polygons on layer "B" are enlarged so that the minimum distance between enlarged polygons 180 and 190, distance 210, is 0.6 microns, thus meeting the minimum spacing requirements set forth in the layout rules. The minimum distance between enlarged polygon 170 and enlarged polygon 180, distance 200, is slightly more than 0.6 microns, thus meeting the minimum distance requirements for polygons on layer "B," as set forth in the layout rules.

The invention can also be applied to situations in which the generated polygons are reduced in size. In reducing the size of a polygon, minimum spacing requirements set forth in the layout rules become problematic not with the corners of two spaced apart polygons, but with respect to the internal distance between corners within a polygon.

Figure 6:
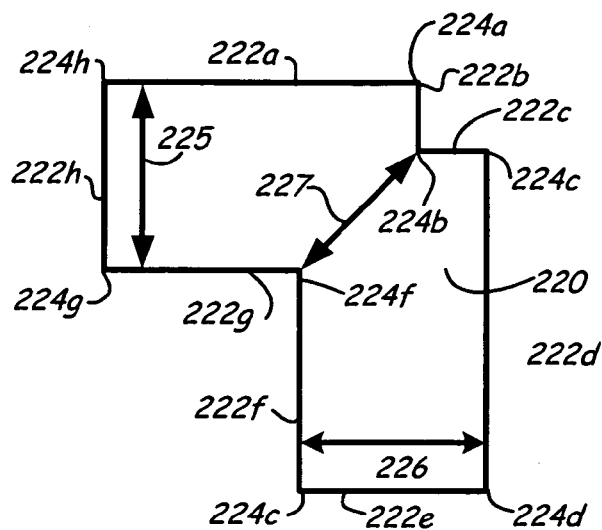
FIG. 6 shows a polygon with interior corners.
Figure 7:
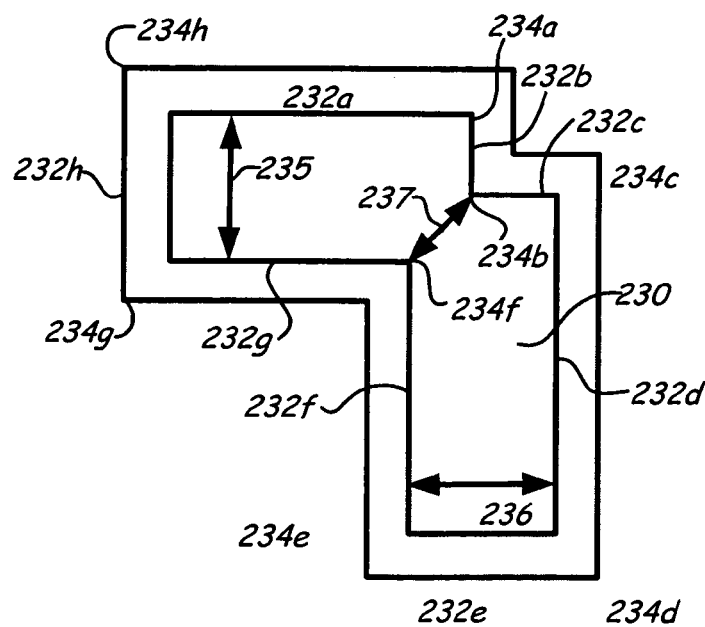
FIG. 7 shows the polygon of FIG. 6 after it has been copied and reduced.

An example such a problem is shown if FIGS. 6 and 7. FIG. 6 shows polygon 220 with sides 222a, 222b, 222c, 222d, 222e, 222f, 222g and 222h and with corners 224a, 224b, 224c, 224d, 224e, 224f, 224g and 224h. The minimum distance between any points on the boundary of the polygon is the distance 225 between sides 222a and 222g, the distance 226 between sides 222d and 222f, and the distance 227 between corners 224b and 224f. Distances 225, 226 and 227 are all equal in this particular example.

FIG. 7 shows reduced polygon 230 with sides 232a, 232b, 232c, 232d, 232e, 232f, 232g and 232h and with corners 234a, 234b, 234c, 234d, 234e, 234f, 234g and 234h. Polygon 230 is created by pulling in each side of polygon 220 by an amount that is the same for all of the sides. The distance between side 232a and side 232g is shown as distance 235, the distance between side 232d and side 232f is shown as distance 236, and the distance between corner 234b and corner 234f is shown as distance 237. As in the previous examples, the distance between the corners decreases at a greater rate than the distances between sides. Thus, while distances 235 and 236 are still equal in reduced polygon 230, distance 237 is smaller than distance 235 or distance 236.

For example, assume that the layout rules require a minimum spacing of 1.0 microns on layer "A" and 0.6 microns on layer "B." Also assume that distances 225, 226 and 227 of original polygon 220 on layer "A" are all equal to 1 micron. Polygon 220 is then copied to layer "B" and reduced in size, becoming reduced polygon 230, in such a way that distances 235 and 236 are both equal to 0.6 microns. Distances 235 and 236 do not violate the layout rules. However, distance 237, the distance between corners 238b and 238f, is less than 0.6 microns, which violates the minimum spacing requirement of the layout rules.

Figure 8:
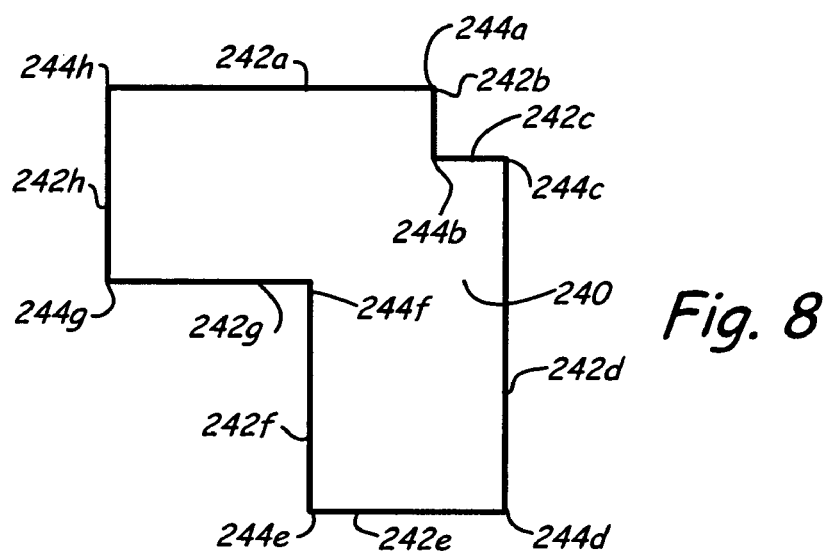
FIG. 8 shows a copy of the polygon in FIG. 6.
Figure 9:
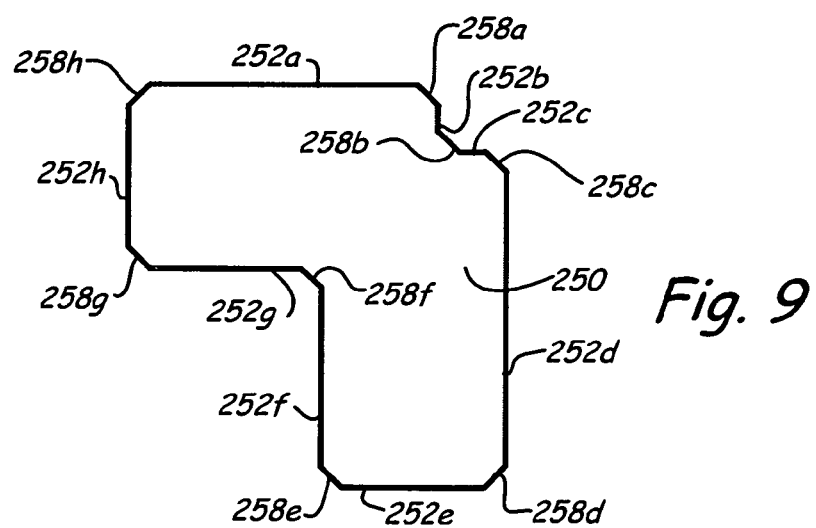
FIG. 9 shows the polygon of FIG. 6 with its corners chamfered.
Figure 10:
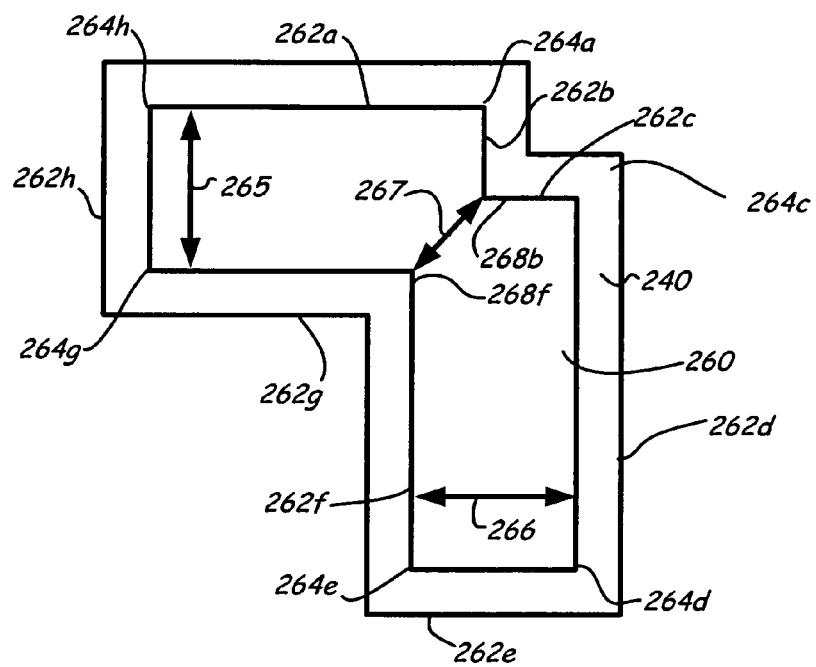
FIG. 10 shows the polygon of FIG. 9 after it has been reduced. It also shows the polygons of FIG. 8 for comparison.
Figure 11:
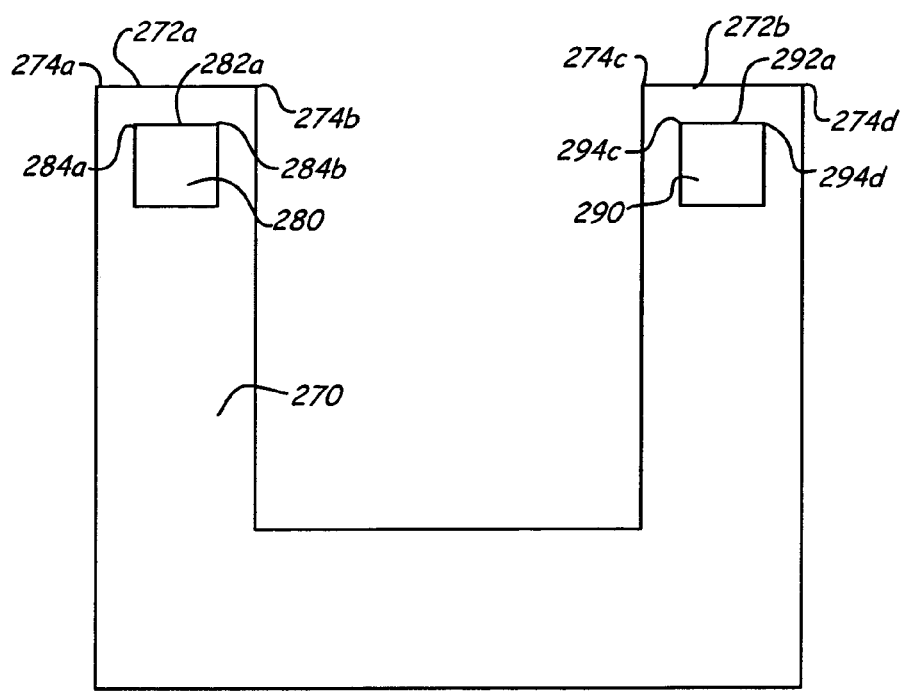
Figure 12:
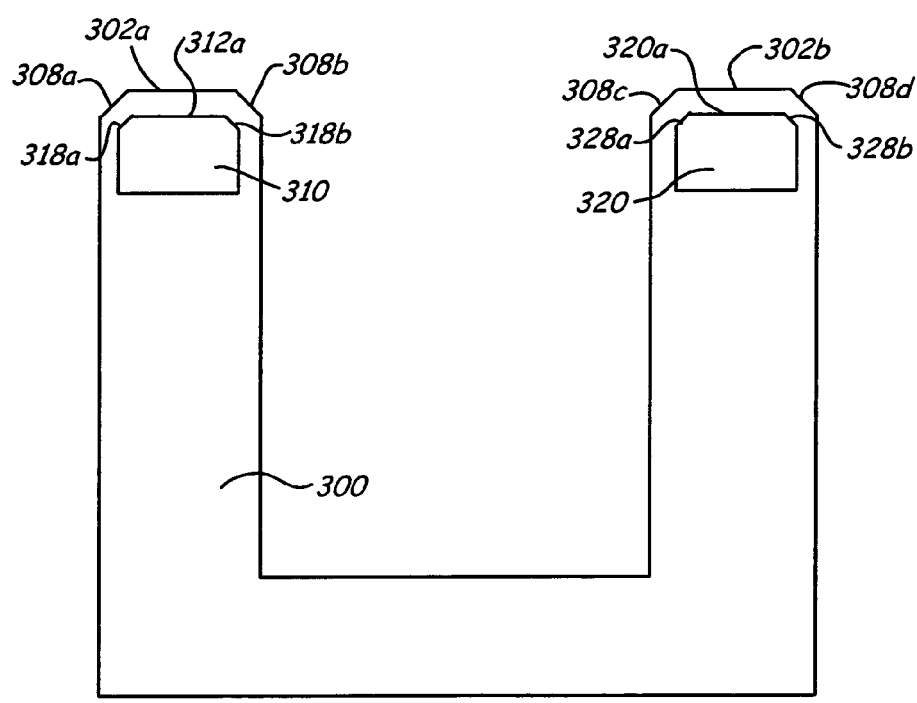

FIGS. 8–10 show how this problem is solved by the invention. First, polygon 220 is copied to layer "B." FIG. 8 shows polygon 240, which is a copy on layer "B" of polygon 220. Polygon 240 has sides 242a, 242b, 242c, 242d, 242e, 242f, 242g and 242h and has corners 244a, 244b, 244c, 244d, 244e, 244f, 244g and 244h.

Next, all of the corners of polygon 240 are chamfered, creating chamfered polygon 250, which is shown in FIG. 9. Chamfered polygon 250 has sides 252a, 252b, 252c, 252d, 252e, 252f, 252g and 252h and chamfered sides 258a, 258b, 258c, 258d, 258e, 258f, 258g and 258h. Note that with respect to interior corners 254b and 254f, chamfering adds area to the corner, rather than subtracting area, as it does with respect to exterior corners.

The third and final step of the invention is to reduce chamfered polygon 250. The result is reduced polygon 260, which is shown in FIG. 10. Reduced polygon 260 has sides 262a, 262b, 262c, 262d, 262e, 262f, 262g and 262h, corners 264a, 264c, 264d, 264e, 264g and 264h, and chamfered sides 268b and 268f. Polygon 260 also has internal distances 265, 266 and 267. Distance 265 is the distance between side 262a and side 262g. Distance 266 is the distance between side 262d and side 262f. Distance 267 is the distance between chamfered side 268b and chamfered side 268f.

Chamfering the corners of polygon 220 avoids violation of the minimum spacing requirements in the layout rules. As with the previous examples, assume that the layout rules require a minimum spacing of 1.0 microns on layer "A" and a minimum spacing of 0.6 microns on layer "B," and that distances 225, 226 and 227 of original polygon 220 on layer "A" are all equal to 1 micron. Polygon 220 is copied to layer "B," becoming polygon 240. The corners of polygon 240 are chamfered, creating chamfered polygon 250. Next, chamfered polygon 250 is reduced to become polygon 260 by pulling the sides in by 0.2 microns. As a result, the distances 265 and 266 in reduced polygon 260 are equal to 0.6 microns. Distance 267, which is the distance between chamfered side 268b and 268f of reduced polygon 260, will be slightly more than 0.6 microns, because the corresponding sides 258b and 258f were slightly more than 1 micron apart prior to the reduction in size. Thus, none of the points along the boundary of reduced polygon 260 on layer "B" violates the minimum spacing rules for layer "B."

The magnitude of the chamfering done to the corners of a polygon can vary according to design parameters. Layout of polygons is typically done with a computer program. The program allows the designer to draw the polygons on a grid. Thus, the sides of each polygon are a certain number of grid spaces in length. The minimum increment of length allowed by the program is one grid space. Thus, the minimum amount that a corner may be chamfered is one grid space.

The invention has been demonstrated by examples in which chamfering is performed with a straight line. However, the invention is not limited to chamfering with straight lines. Even less spacing errors will result if the corners of polygons are chamfered by rounding off the corners, thereby replacing corners with arcs of circles, rather than chamfering with a straight line.

The invention does not require that all corners of all polygons of a layout must be chamfered. In a given polygon or group of polygons, some of the corners will present potential spacing problems and some will not. For example, in the group of polygons shown in FIG. 3, corners 114c and 124a were identified as the source of potential spacing problem. The remaining ten corners did not present any potential spacing problems. Chamfering every corner makes the method easier to implement with a computer program, since it removes the need to make decisions as to potential spacing problems. However, the method of the invention may alternatively include the step of identifying corners of polygons that present potential spacing problems, and then chamfering only those identified corners of the polygons. Identification could be performed manually or with a computer program.

Thus, the invention solves the problem of satisfying minimum spacing requirements in a semiconductor layout when the scale of polygons is changed. Chamfering the corners of the polygons, thereby replacing the corners with additional sides, eliminates the problem caused by corners and sides changing size at different rates. The chamfered sides change size at a similar rate to the other sides of the polygon.

Although the present invention has been described with reference to preferred embodiments, workers skilled in the art will recognize that changes may be made in form and detail without departing from the spirit and scope of the invention.

The invention claimed is:

1. A method for generating a polygon in a layout of a semiconductor circuit to satisfy minimum spacing requirements of layout rules, the method comprising:
generating at least one polygon for the layout, the at least one polygon having a plurality of corners and having an area, and the at least one polygon satisfying the minimum spacing requirements of the layout rules;
chamfering the corners of the at least one polygon; and
changing an area of the at least one polygon after chamfering the corners.

2. The method according to claim 1 wherein the corners of the at least one polygon are chamfered one grid space.

3. The method of claim 1 wherein the corners of the at least one polygon are chamfered with straight lines.

4. The method of claim 1 wherein the corners of the at least one polygon are chamfered with arcs.

5. The method of claim 1 wherein the area of the at least one polygon is increased after chamfering the corners.

6. The method of claim 5 wherein only exterior corners of the at least one polygon are chamfered.

7. The method of claim 1 wherein the area of the at least one polygon is decreased after chamfering the corners.

8. The method of claim 7 wherein only interior corners of the at least one polygon are chamfered.

9. The method of claim 1 wherein the method is performed by a computer program.

10. A method for generating a polygon in a layout of a semiconductor circuit to satisfy minimum spacing requirements of layout rules, the method comprising:
generating at least one polygon for the layout, the at least one polygon having a plurality of corners and having an area, and the at least one polygon satisfying the minimum spacing requirements of the layout rules;
making a copy of the at least one polygon;
chamfering the corners of the copy of the at least one polygon; and
changing an area of the copy of the at least one polygon after chamfering the corners.

11. The method according to claim 10 wherein the corners of the copy of the at least one polygon are chamfered one grid space.

12. The method of claim 10 wherein the corners of the at least one polygon are chamfered with straight lines.

13. The method of claim 10 wherein the corners of the at least one polygon are chamfered with arcs.

14. The method of claim 10 wherein the area of the copy of the at least one polygon is increased after chamfering the corners.

15. The method of claim 14 wherein only exterior corners of the copy of the at least one polygon are chamfered.

16. The method of claim 10 wherein the area of the copy of the at least one polygon is decreased after chamfering the corners.

17. The method of claim 16 wherein only interior corners of the copy of the at least one polygon are chamfered.

18. The method of claim 10 wherein the method is performed by a computer program.

19. A method for generating a polygon in a layout of a semiconductor circuit to satisfy minimum spacing requirements of layout rules, the method comprising:
generating at least one polygon for the layout, the at least one polygon having a plurality of corners and having an area, and the at least one polygon satisfying the minimum spacing requirements of the layout rules;
making a copy of the at least one polygon;
identifying corners of the copy of the at least one polygon that will cause spacing problems;
chamfering the identified corners of the copy of the at least one polygon; and
changing an area of the copy of the at least one polygon after chamfering the identified corners.

20. The method according to claim 19 wherein each corner of the copy of the at least one polygon is chamfered one grid space.

21. The method of claim 19 wherein the corners of the copy of the at least one polygon are chamfered with straight lines.

22. The method of claim 19 wherein the corners of the copy of the at least one polygon are chamfered with arcs.

23. The method of claim 19 wherein the area of the copy of the at least one polygon is increased after chamfering the identified corners.

24. The method of claim 23 wherein only exterior corners of the copy of the at least one polygon are chamfered.

25. The method of claim 19 wherein the area of the copy of the at least one polygon is decreased after chamfering the identified corners.

26. The method of claim 25 wherein only interior corners of the copy of the at least one polygon are chamfered.

27. The method of claim 19 wherein the method is performed by a computer program.

* * * * *